(12) United States Patent
Lofland et al.

(10) Patent No.: US 7,316,263 B2
(45) Date of Patent: Jan. 8, 2008

(54) COLD PLATE

(75) Inventors: Steve J. Lofland, Portland, OR (US); Mark A. Trautman, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 294 days.

(21) Appl. No.: 10/718,397

(22) Filed: Nov. 19, 2003

(65) Prior Publication Data

US 2005/0103472 A1    May 19, 2005

(51) Int. Cl.
*H05K 7/20* (2006.01)
*F28F 3/12* (2006.01)

(52) U.S. Cl. ............... 165/80.4; 165/170; 257/714; 361/699

(58) Field of Classification Search ............... 165/80.4, 165/168, 170; 257/714; 361/699
See application file for complete search history.

(56) References Cited

U.S. PATENT DOCUMENTS

| | | | | |
|---|---|---|---|---|
| 840,667 A | * | 1/1907 | Speed et al. ............... | 165/167 |
| 1,413,571 A | * | 4/1922 | Bronander ................... | 165/170 |
| 1,539,887 A | * | 6/1925 | Vandergrift ................. | 165/170 |
| 3,387,653 A | * | 6/1968 | Coe ........................... | 165/170 |
| 4,085,728 A | * | 4/1978 | Tomchak ..................... | 165/170 |
| 4,714,107 A | * | 12/1987 | Adsett ........................ | 165/170 |
| 5,152,337 A | * | 10/1992 | Kawakatsu et al. ......... | 165/153 |
| 5,198,752 A | * | 3/1993 | Miyata et al. ............. | 165/80.4 |
| 5,239,200 A | * | 8/1993 | Messina et al. ............. | 257/714 |
| 6,209,202 B1 | * | 4/2001 | Rhodes et al. .............. | 165/177 |
| 2002/0070006 A1 | * | 6/2002 | Mok et al. ................. | 165/80.4 |

OTHER PUBLICATIONS

Fraas et al, "Heat Exchanger Design, " 1965, John Wiley and Sons, p. 33.*
Fraas et al, "Heat Exchanger Design," 1965, John Wiley and Sons, pages cover, 33, 351, 352.*

* cited by examiner

*Primary Examiner*—Leonard R Leo
(74) *Attorney, Agent, or Firm*—Rob Anderson of Intel Corporation

(57) ABSTRACT

A novel cold plate may include one or more of the following features: relatively narrow channel gaps, two or more flow paths, primarily non-linear flow paths, and/or tapered channel walls.

11 Claims, 7 Drawing Sheets

COLD PLATE

The invention relates to thermal management of electronic systems, and more particularly to a novel cold plate for a liquid cooling system.

BACKGROUND AND RELATED ART

Modern electronic devices such as computer systems have not only microprocessor chips, including Intel® i386, i486, Celeron™ or Pentium® processors, but also many other integrated circuits (ICs) and other electronic components, most of which are mounted on printed circuit boards (PCBs). Many of these components generate heat during normal operation. Components that have a relatively small number of functions in relation to their size, as for example individual transistors or small scale integrated circuits (ICs), usually dissipate all their heat without a heatsink. However, more complex components may dissipate an amount of heat which requires the assistance of external cooling devices such as heatsinks.

Heatsinks may be passive devices, for example an extruded aluminum plate with a plurality of fins, that are thermally coupled to a heat source, e.g. an electronic component such as a microprocessor, to absorb heat from the electronic component. The heatsinks dissipate this heat into the air primarily by convection.

Common materials for heatsinks include copper (Cu) or aluminum (Al) based heatsinks with either extruded, folded, or skived fins with no fan or with an active fan to promote airflow efficiency. A retention mechanism such as a clip is sometimes required to secure the heatsink onto an electronic package across the heat dissipation path. An active fan is often mounted on top of the heatsinks to transfer heat, during operation, from a heat source to the ambient air, via the fins.

Figure 1:
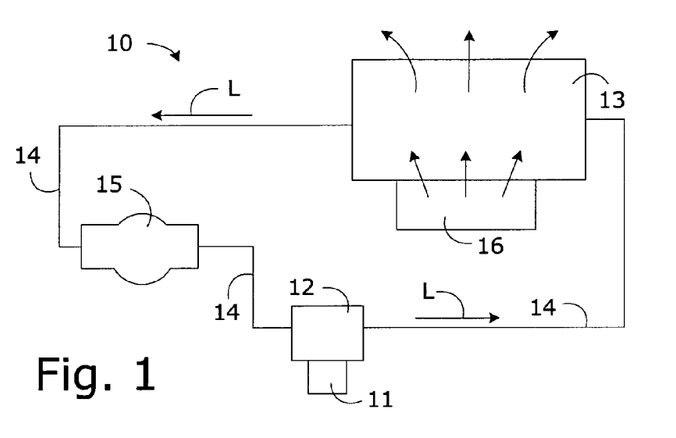
FIG. 1 is a schematic view of a system utilizing liquid cooling.
Figure 2:
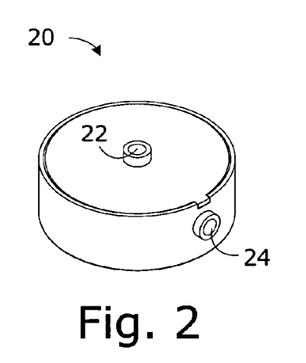
FIG. 2 is a perspective view of a cold plate according to some embodiments of the invention.
Figure 3:
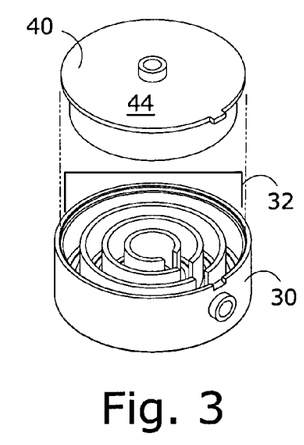
FIG. 3 is an exploded, perspective view of the cold plate from FIG. 2.
Figure 4:
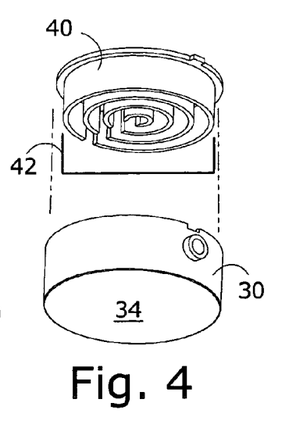
FIG. 4 is another exploded, perspective view of the cold plate from FIG. 2.

High power electronic systems such as consumer computer systems or servers may require or benefit from liquid cooling in place of or in addition to other cooling devices. With reference to FIG. 1, a liquid cooled system 10 includes a heat source 11 (e.g. a processor or other electronic device). A cold plate 12 is mechanically and thermally coupled to the heat source 11. The cold plate 12 is in liquid communication with a heat dissipation device 13 (e.g. a condensor and/or radiator). Cooling liquid is circulated from the cold plate 12 to the device 13 and back again to provide a cooling cycle. For example, the cold plate 12 may be connected in a loop to the device 13 by tubing 14. A pump 15 may be provided in line with one branch of the tubing 14 to circulate the cooling liquid contained in the tubing 14 (e.g. in the direction of arrows L). The system 10 may include an optional fan 16 to provide air flow for the heat dissipation device 13 and/or the cold plate 12.

One function of the cold plate 12 is to transfer a heat load from the heat source 11 to the liquid that is circulated through the cold plate 12. Conventional cold plates may be manufactured in low volume by machining out feature details in a piece of metal stock. Higher volume manufacturing techniques such as die casting may also be utilized to manufacture cold plates. However, the higher volume techniques are generally limited in the materials that may be utilized (e.g. lower performance materials such as aluminum, zinc, or magnesium). Also, the higher volume manufacturing techniques are generally limited in terms of the size of the geometries that may be cost effectively made. In particular, smaller geometries are generally more difficult to die cast and/or more expensive to die cast.

BRIEF DESCRIPTION OF THE DRAWINGS

Various features of the invention will be apparent from the following description of preferred embodiments as illustrated in the accompanying drawings, in which like reference numerals generally refer to the same parts throughout the drawings. The drawings are not necessarily to scale, the emphasis instead being placed upon illustrating the principles of the invention.

DESCRIPTION

In the following description, for purposes of explanation and not limitation, specific details are set forth such as particular structures, architectures, interfaces, techniques, etc. in order to provide a thorough understanding of the various aspects of the invention. However, it will be apparent to those skilled in the art having the benefit of the present disclosure that the various aspects of the invention may be practiced in other examples that depart from these specific details. In certain instances, descriptions of well known devices, circuits, and methods are omitted so as not to obscure the description of the present invention with unnecessary detail.

One aspect of some embodiments of the invention relates to creating narrow channels in a cold plate using a two piece design. Two separate pieces each define channel walls having respective gaps between respective facing walls. When the two pieces are brought together, the channel walls from each piece interlace to create a new set of channel walls having relatively narrower respective gaps between respective facing walls.

Figure 12:
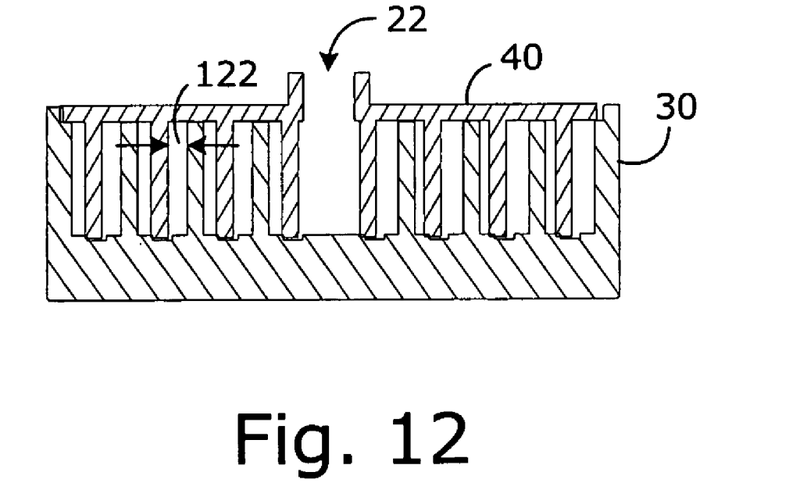
FIG. 12 is a schematic, cross section view of an example assembled cold plate for FIG. 11.

With reference to FIGS. 2-15, a cold plate 20 according to some embodiments of the invention is assembled from two sub-assemblies. The cold plate 20 includes a first member 30 defining a first set of channel walls 32. The first set of channel walls 32 have a first channel gap 72 (see FIG. 7) between two respective facing walls of the first set of channel walls 32. The cold plate 20 further includes a second member 40 defining a second set of channel walls 42, the second member 40 being coupled to the first member 30 such that the second set of channels walls 42 are interlaced with the first set of channel walls 32 (see FIGS. 12 and 14). A fluid inlet 22 is provided on either one of the first and second members 30 and 40 (as illustrated the inlet 22 is provided on the second member 40). A fluid outlet 24 is also provided on either one of the first and second members 30 and 40 (as illustrated the outlet 24 is provided on the first member 30. A second channel gap 122 (see FIG. 12) between two respective facing walls of the interlaced first set of channel walls 32 and the second set of channel walls 42 is narrower than the first channel gap 72. Typical applications for the cold plate 20 include cooling of processors or other electronic components in servers, desktop servers, and other computers.

The size of the passages in a cold plate bear on the thermal performance of the cold plate because the fluid heat transfer rates increase with the inverse of the channel gap. Therefore, smaller gaps produce higher heat transfer rates and lead to a higher performance, lower thermal resistance cold plate. In other words, narrower channel gaps are better for cold plates. However, as noted above, narrower channel gaps are more difficult and costly to manufacture with high volume manufacturing techniques.

Some embodiments of the present invention overcome this problem by providing a cold plate having narrow channel gaps and which may be manufactured in high volume at relatively lower cost. Specifically, some embodiments of the invention include providing a first member having a first set of channels wall, providing a second member having a second set of channel walls, and interlacing the first set of channel walls with the second set of channel walls. The resulting channels of the interlaced walls are relatively narrower as compared to the channels of either of the members separately. However, the larger channels of the separate members are relatively less complex and costly to manufacture in high volume. Advantageously, when the two members are brought together the resulting cold plate provides good thermal performance and may be manufactured in high volume at a relatively lower cost.

Figure 5:
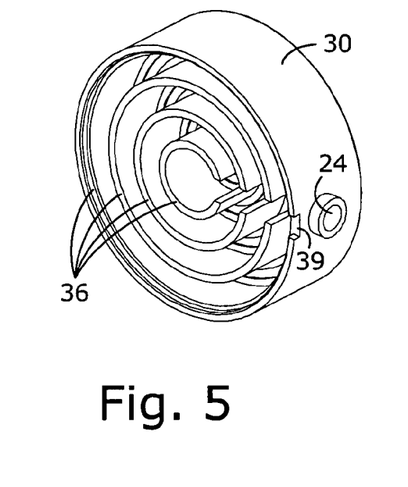
FIG. 5 is a perspective view of a base portion of the cold plate from FIG. 2.
Figure 6:
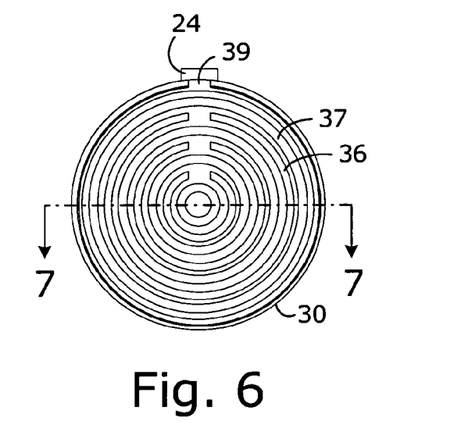
FIG. 6 is a top view of the base portion of the cold plate from FIG. 6.
Figure 7:
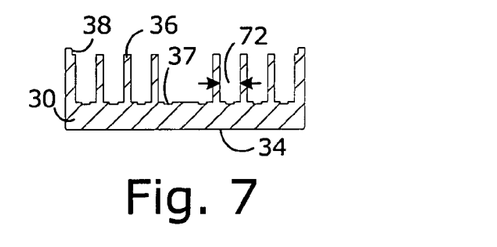
FIG. 7 is a cross section view taken along line 7-7 in FIG. 6.

With reference to FIGS. 5-7, the first member 30 may be the first half of a two piece assembly for the cold plate 20. The first member 30 may include a substantially planar base portion 34 with a plurality of substantially perpendicular protrusion or fins 36 extending from the base portion 34. For example, the fins 36 are arranged to form the first set of channel walls 32. The first member 30 may include one or more optional grooves 37 in the base portion 34. The grooves 37 are adapted to receive end portions of one or more of the second set of channel walls 42.

Figure 8:
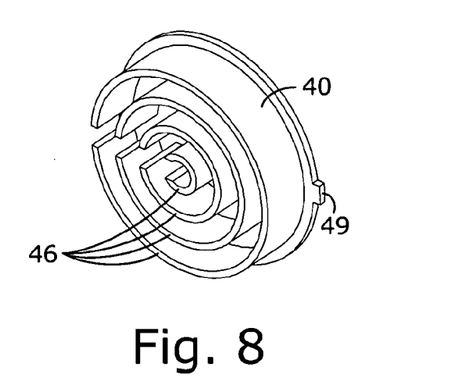
FIG. 8 is a perspective view of a lid portion of the cold plate from FIG. 2.
Figure 9:
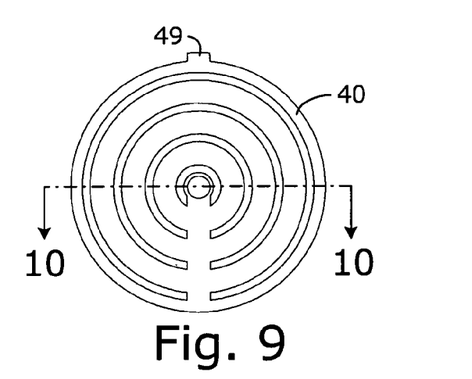
FIG. 9 is a bottom view of the lid portion of the cold plate from FIG. 9.
Figure 10:
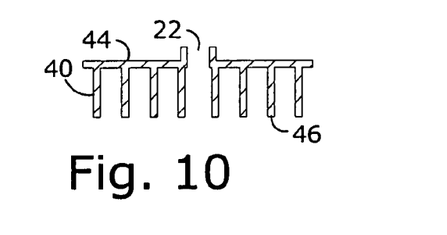
FIG. 10 is a cross section view taken along line 10-10 in FIG. 9.
Figure 11:
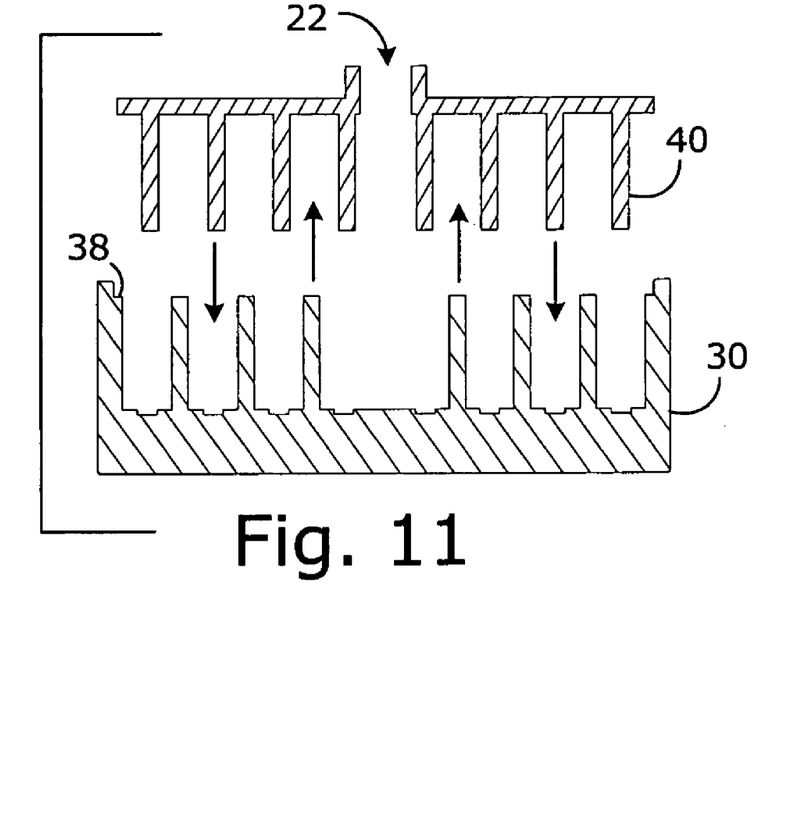
FIG. 11 is a schematic, cross section view showing an example assembly process for the base and lid portions.

With reference to FIGS. 8-10, the second member 40 may be the second half of the two piece assembly for the cold plate 20. The second member 40 may include a substantially planar lid portion 44 with a plurality of substantially perpendicular protrusion or fins 46 extending from the lid portion 44. For example, the fins 46 are arranged to form the second set of channel walls 42. Although omitted in the illustrated example, the second member may also include one or more optional grooves in the lid portion 44 which may be adapted to receive the fins 36 of the first member 30.

In the illustrated example, the first member 30 defines a shoulder 38 (see FIG. 7) which is sized to receive the lid portion 44 of the second member 40. The two members 30 and 40 may include an optional keying feature to assist in a desired alignment of the two members 30 and 40. For example, the first member 30 may further define a slot 39 which is adapted to mate with a corresponding tab 49 in the second member 40. Other indexing or keying features may be utilized.

With reference to FIGS. 11-15, the first and second set of walls 32 and 42 are arranged such that they do not mechanically interfere with each when the two members 30 and 40 are fitted together. For example, for a cylindrical cold plate as illustrated, each wall of the first set of walls 32 has a different diameter as compared to each wall of the second set of walls 42 (see FIG. 14). In addition, a thickness of each wall of the first set of walls 32 is selected to not interfere with the second set of walls 42 and to provide a desired channel gap when interlaced with the second set of walls 42. The length or depth of the fins 36 of the first member 30 are preferably selected to contact the lid portion 44 of the second member 40. Likewise, the length or depth of the fins 46 are preferably selected to contact the base portion 34 of the first member 30. For example, the fins 46 may be received in the grooves 37. Preferably, leakage is inhibited between respective channel walls so that the fluid flows along desired paths. However, some leakage may be tolerated without substantially affecting the predominant flow paths. Although less preferred, in some embodiments the respective fins 36 and 46 may have selected lengths that do not contact the respective base and lid portions, such that flow paths are provided that flow over the walls 32 and 42 instead of or in addition to the channels between the walls.

When the two members are sealed together, the resulting sealed enclosure may provide a higher fluid channel aspect ratio than can be currently produced using casting methods in high volumes. The channel widths provided by some embodiments of the present invention are not easily manufactured in high volume processes if the features are all part of a single piece casting with any of previously known metal casting methods that apply to highly conductive metals such as copper. Copper or similar thermally performing materials may be preferred for a high performance cold plate. However, copper is not typically used for casting of high performance cold plates because small feature sizes are difficult to cast in copper. Advantageously, because some embodiments of the invention facilitate relatively larger feature sizes of the two halves, casting or forging of the two members in copper may be possible, depending on the particular application. Alternatively, because some embodiments of the invention provide narrower channel gaps (which offer better thermal performance), lower performance materials such as aluminum may be utilized (at lower manufacturing costs) while providing satisfactory thermal performance.

The two members may be manufactured by any previously known or hereinafter discovered technique for forming parts. For example, the two members 30 and 40 may be manufactured by machining, metal die-casting, powder metal/sintering, and forging. Preferably, each of the two members is manufactured as a monolithic sub-assembly. However, the two members 30 and 40 may be manufactured in several stages including, for example, forming the base and lid portions separately and thereafter attaching the protruding walls. For example, it is believed that most of the cooling occurs at the walls and the lid and/or base portions may be made from less thermally conductive materials (e.g. plastic, metal-clad plastic or ceramic).

The two members may be joined by any previously known or hereinafter discovered technique including sealing the two pieces around the perimeter, mechanical fitting (e.g. press fit), epoxy, metallurgical bond, and/or brazing. For example, the two halves of the cold plate 20 may be bonded together by either a brazing or soldering process around the circumference of the parts (e.g. at the junction of the shoulder 39 an the lid 44). The two members 30 and 40 may be further bonded at all of the interfacing protrusion features (e.g. the grooves 37). Preferably, the bonding process seals the two members 30 and 40 together so that the cold plate 20 is a liquid tight unit. In addition, the bonding process preferably provides good thermal contact between the two members 30 and 40 for good thermal performance. A metallurgic bond may be preferred. However, the cold plate may be sealed with adhesives, mechanical fastener, or other suitable techniques.

Figure 16:
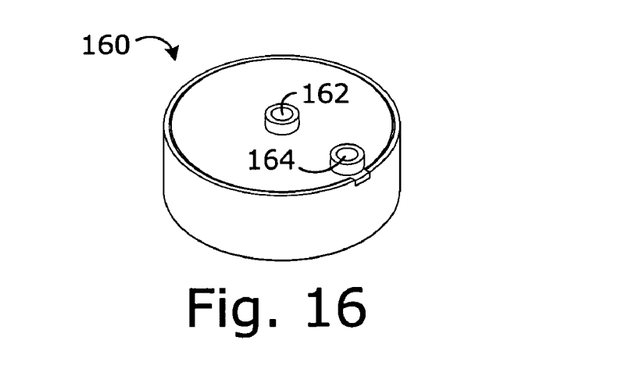
FIG. 16 is a perspective view of another cold plate according to some embodiments of the invention.

With reference to FIG. 16, the inlet and outlet for the cold plate may be positioned at any suitable location. For example, a cold plate 160 includes an inlet 162 and an outlet 164 which are both located on the lid portion of the cold plate. Alternatively, in some applications the inlet and outlet may both be located on the base portion and in other applications the inlet may be located on the base portion and the outlet may be located on the lid portion. In some embodiments, the inlet and outlet may be co-located or located very near to each other, with suitable flow paths provided internal to the cold plate between the inlet and the outlet. The cold plate may have any suitable shape or footprint, including for example, cylindrical (as illustrated), elliptical, and square or rectangular box-shaped or arbitrarily-shaped as may be desired for a particular application.

Figure 17:
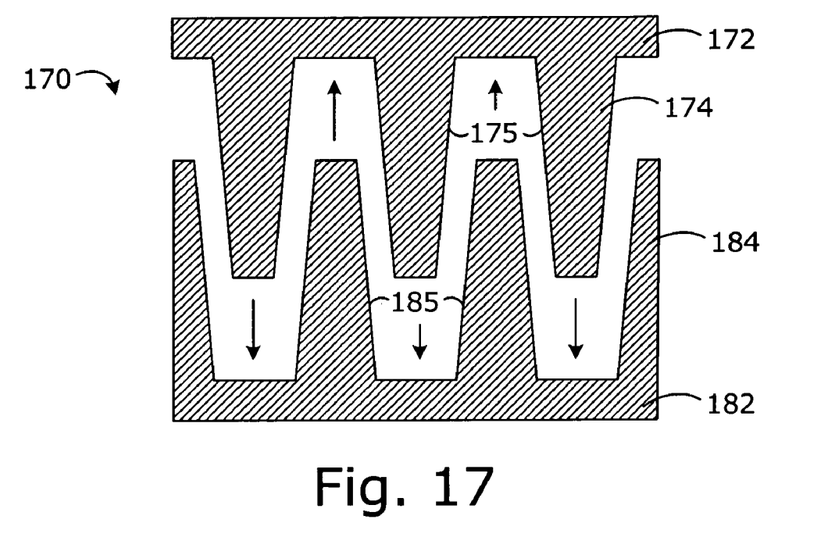
FIG. 17 is a schematic, cross section view showing an example assembly process for another pair of base and lid portions according to some embodiments of the invention.
Figure 18:
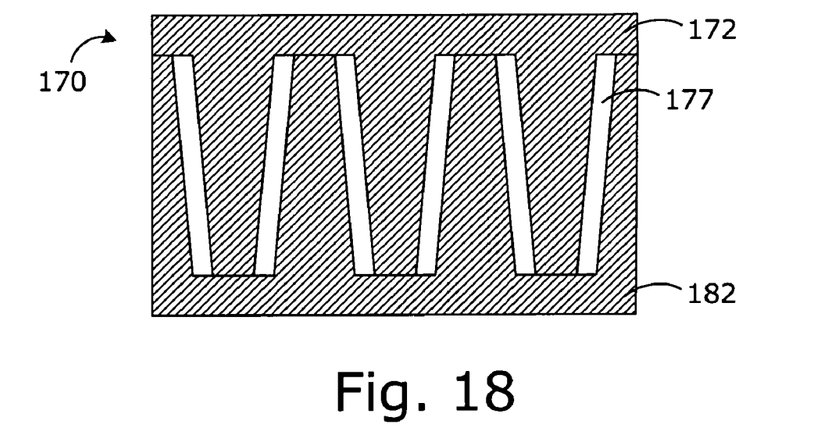
FIG. 18 is a schematic, cross section view of an example assembled cold plate for FIG. 17.

With reference to FIGS. 17-18, another aspect of some embodiments of the invention relates to the use of relatively highly tapered channel walls. A cold plate 170 includes a first member 172 having a first set of channels walls 174. The cold plate 170 further includes a second member 182 having a second set of channel walls 184. One or both surfaces of at least one of the channel walls is tapered at an angle of greater than about five degrees. Preferably, all of the internal walls surfaces 175 an 185 are tapered in a complimentary manner to define relatively narrow channels 177 between respective facing walls when the two members 172 and 182 are coupled together.

Although in the other Figures, many of the walls appear precisely perpendicular to the lids/bases, for casting purposes the walls may be slightly tapered (e.g. between 0.5° and 3°) in the casting mold to assist in removal of the part from the mold. According to some embodiments, a highly tapered wall surface is utilized to increase the exposed surface area of the wall. For example, some embodiments may include walls tapered at an angle of greater than about five percent and preferably between 5° and 15° to increase the wall area exposed to the cooling fluid and thereby increase cooling efficiency. Advantageously, increased efficiency in cooling may facilitate use of less expensive materials (e.g. aluminum instead of copper) while providing satisfactory cooling.

With both surfaces of the wall tapered, the resulting channel walls have a triangular prism fin design. The triangular fins have a relatively larger surface area exposed to the fluid as compared parallel or straight fins (or slightly tapered fins for casting), and the triangular cross section is good for reducing heat conduction losses through the fin as compared to a similar mass straight fin (or slightly tapered). Relatively larger cross section fins provide relatively narrower fluid passages and the highly tapered even are especially suitable for casting because of the natural draft provided by the triangular fin design.

Figure 19:
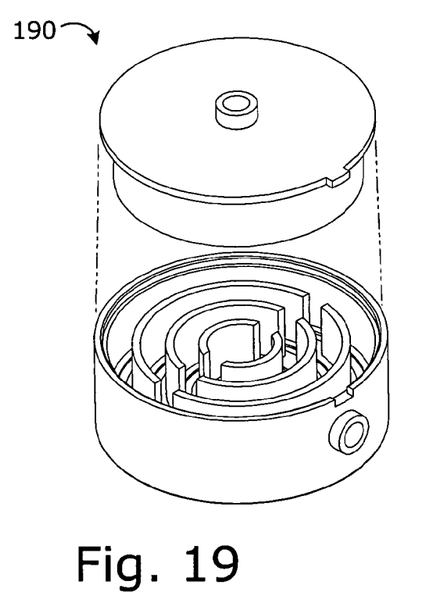
FIG. 19 is an exploded, perspective view of another cold plate according to some embodiments of the invention.
Figure 20:
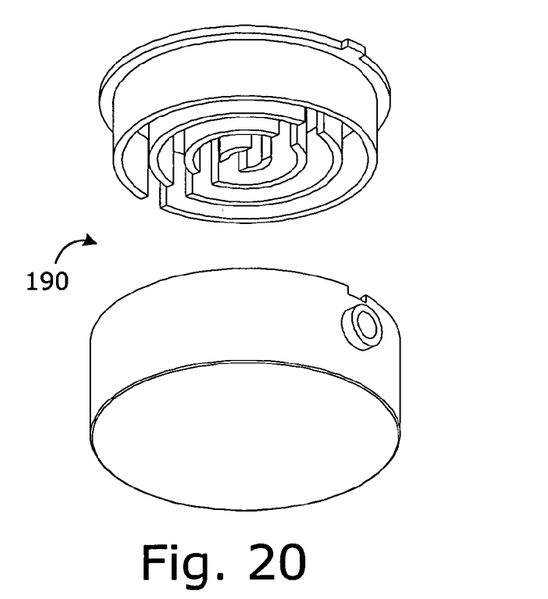
FIG. 20 is another exploded, perspective view of the cold plate from FIG. 19.
Figure 21:
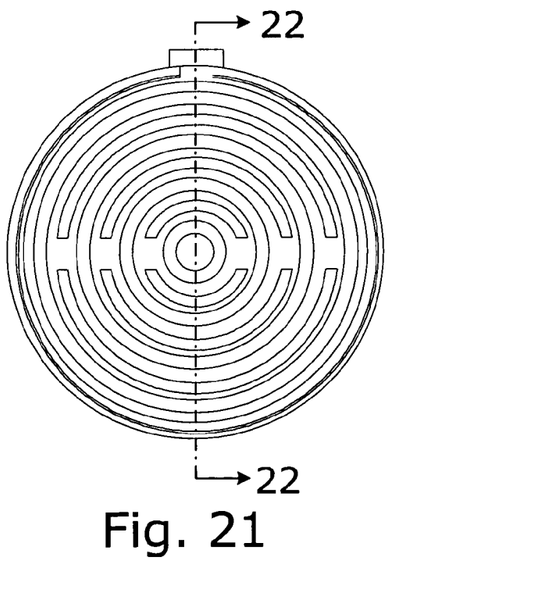
FIG. 21 is a top view of a base portion of the cold plate from FIG. 19.
Figure 22:
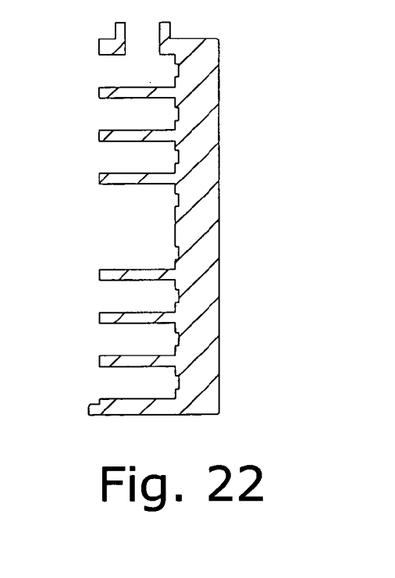
FIG. 22 is a cross section view taken along line 22-22 in FIG. 21.
Figure 23:
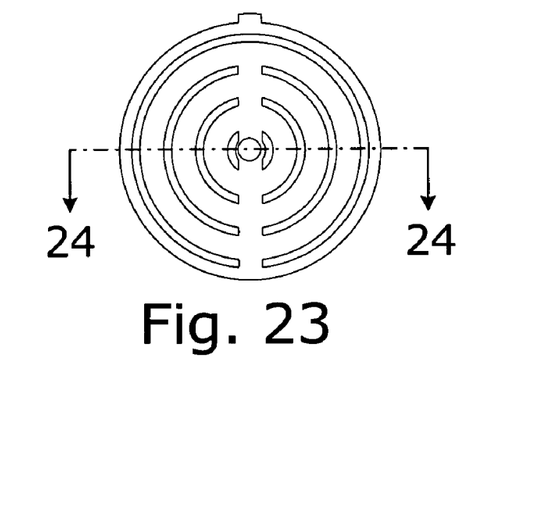
FIG. 23 is a bottom view of a lid portion of the cold plate from FIG. 19.
Figure 24:
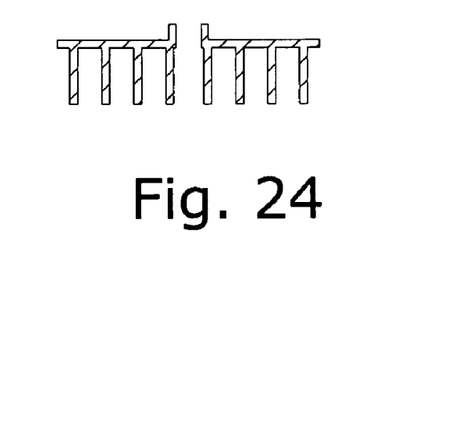
FIG. 24 is a cross section view taken along line 24-24 in FIG. 23.
Figure 25:
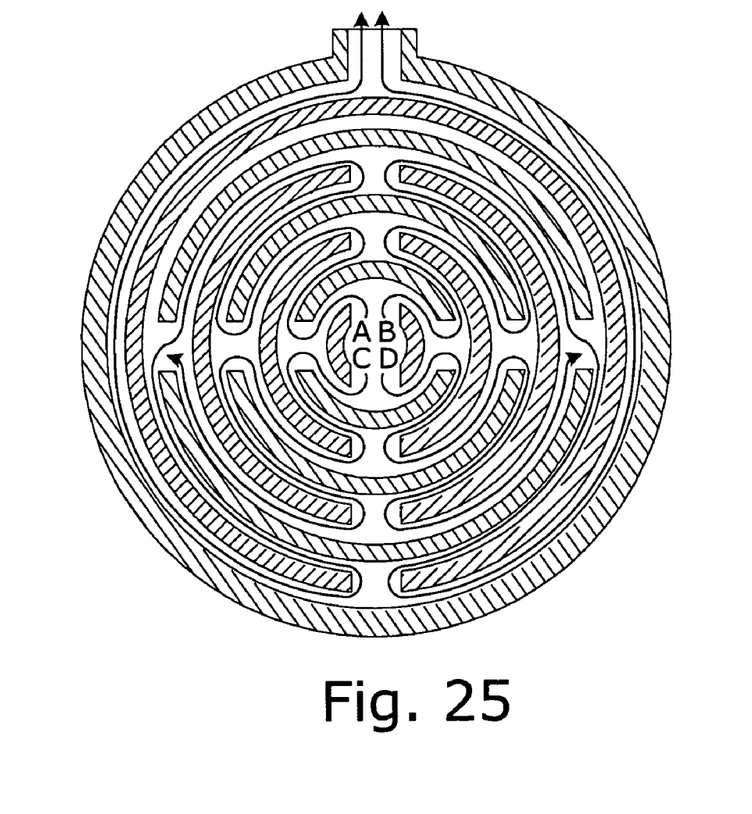
FIG. 25 is a schematic, cross section view of the cold plate from FIG. 19, showing example flow paths according to some embodiments of the invention.

Another aspect of the invention relates to a preferred location for the inlet of the cold plate. In some embodiments, the inlet is located near a relatively hotter spot of the electronic component coupled to the cold plate. For example, in accordance with some embodiments, cooling fluid enters an inlet located in a central area of the cold plate (e.g. see FIGS. 2, 16, and 19). The fluid which circulates through the liquid cooling system may be coolest at the inlet of the cold plate. In many electronic system, the component coupled to the cold plate is hottest near the center of the cold plate. Advantageously, configuring the inlet such that the coolest fluid enters the cold plate near a relatively hotter location on the electronic component increases the surface-to-fluid temperature difference across the cold plate and allows heat to be more efficiently transferred to the fluid (i.e. lower thermal resistance).

Figures 13, 14, 15:
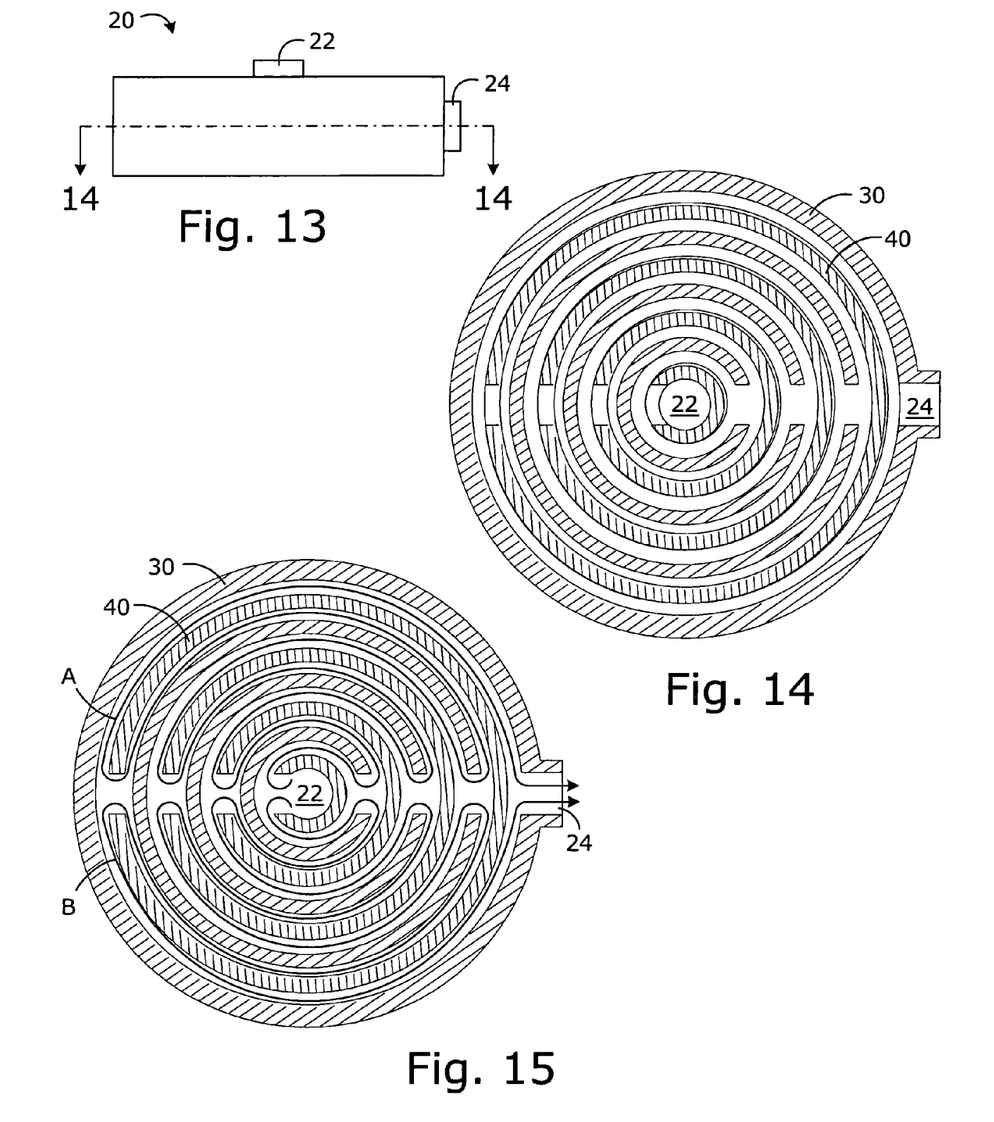
FIG. 13 is a schematic, side view of the cold plate from FIG. 2.
FIG. 14 is a cross section view taken along line 14-14 in FIG. 13.
FIG. 15 is a schematic, cross section view of the cold plate from FIG. 2, showing example flow paths according to some embodiments of the invention.

Another aspect of the invention relates to novel flow paths defined by the internal walls of the cold plate. In some embodiments, two or more flow paths between the inlet and the outlet may be preferred. For example, FIG. 15 shows a channel wall arrangement for a dual-path design. Each member 30 and 40 provides semi-circular channel walls with one break in each wall (except the exterior wall) along a line. When the two members are coupled together, the respective breaks are positioned 180 degrees with respect to each other. In FIG. 15, the channel wall arrangements provides two fluid flow paths A and B having two different flow directions between the fluid inlet and the fluid outlet. As illustrated, this arrangement provides two substantially symmetrical flow paths A and B from the central inlet port 22, merging at the perimeter outlet port 24.

With reference to FIG. 19-25, another cold plate according to some embodiments of the invention provides more than two flow paths from the inlet to the outlet. A cold plate 190 is similarly constructed as the cold plate 20, except that the channel walls of each half provide semi-circular channel walls with two breaks in each wall along the same line (such that the breaks in each half are positioned at 180 degrees with respect to each other). When the two halves are coupled together, the breaks of each member are positioned 90 degrees with respect to each other to provide four flow paths A, B, C, and D at the inlet, which have four different flow directions and subsequently merge prior to the outlet. An advantage of this multi-path design is that it may provide a reduced pressure drop through the cold plate 190 as compared to the dual-path design.

Another aspect of some embodiments of the invention relates to a configuration of the flow paths. Preferably, in some embodiments the number of straight sections along the flow path are minimized or eliminated to promote secondary motion in the cooling fluid. Relatively more winding non-linear paths provided by the flow channel geometry may induce secondary flows (such as streamwise vortices and impingement zones) within the channels that will better mix the fluid and promote higher heat transfer rates from the cold plate surface to the fluid. For example, the various cylindrical cold plates described herein provide primarily non-linear flow paths.

In some preferred embodiments, various of the foregoing aspects are combined to provide a cold plate with good thermal performance that is highly manufacturable. For example, from a heat transfer standpoint, the preferred cylindrical cold plate configuration has several distinct advantages over conventional cold plates. One is the relatively narrow fluid passages or channel gaps. Also, the circular design may be geometrically symmetric with respect to the heat source (e.g. microprocessor), which reduces the heat conduction path from the heat source to the fluid, and provides a low heat spreading thermal conduction loss. Further, the cold fluid enters at the center of the cold plate which may be the hottest location on the cold plate, and therefore the surface-to-fluid temperature difference is increased across the cold plate and allows heat to be more easily transferred to the fluid (i.e. lower thermal resistance). In addition, the winding path created by the flow channel geometry may induce secondary flows (such as streamwise vortices and impingement zones) within the channels that will better mix the fluid and promote higher heat transfer rates from the cold plate surface to the fluid.

The foregoing and other aspects of the invention are achieved individually and in combination. The invention should not be construed as requiring two or more of the such aspects unless expressly required by a particular claim. Moreover, while the invention has been described in connection with what is presently considered to be the preferred examples, it is to be understood that the invention is not limited to the disclosed examples, but on the contrary, is intended to cover various modifications and equivalent arrangements included within the spirit and the scope of the invention.

What is claimed is:

1. A cold plate for cooling an electronic component, comprising:
    a first member defining a first set of semi-circular channel walls, the first set of channel walls having a first channel gap between two respective facing walls of the first set of channel walls;
    a second member defining a second set of semi-circular channel walls, the second member being coupled to the first member such that the second set of channels walls are interlaced with the first set of channel walls;
    a fluid inlet provided on one of the first and second members; and
    a fluid outlet provided on one of the first and second members,
    wherein a channel structure defined by the first and second sets of channel walls provides at least two fluid flow paths having different flow directions between the fluid inlet and the fluid outlet;
    wherein the channel structure defined by the first and second sets of channel walls provides four non-linear flow paths having different flow directions between the fluid inlet and the fluid outlet.

2. The cold plate of claim 1, wherein the fluid inlet is located at a center of the cold plate.

3. The cold plate of claim 1, wherein a surface of a wall of the first set of channel walls is tapered at an angle of greater than about five degrees.

4. A method, comprising:
    forming a first member defining a first set of semi-circular channel walls, the first set of channel walls having a first channel gap between two respective facing walls of the first set of channel walls;
    forming a second member defining a second set of semi-circular channel walls;
    coupling the second member to the first member such that the second set of channels walls are interlaced with the first set of channel walls;
    providing a fluid inlet on one of the first and second members;
    providing a fluid outlet on one of the first and second members;
    providing at least two fluid flow paths having different flow directions between the fluid inlet and the fluid outlet; and
    providing four non-linear flow paths having different flow directions between the fluid inlet and the fluid outlet.

5. The method of claim 4, further comprising:
    providing the fluid inlet at a center of one of the first and second members.

6. The method of claim 4, further comprising:
    tapering a surface of a wall of the first set of channel walls at an angle of greater than about five degrees.

7. A system, comprising:
    an electronic component; and
    a cold plate thermally coupled to the electronic component, the cold plate comprising:
        a first member defining a first set of semi-circular channel walls, the first set of channel walls having a first channel gap between two respective facing walls of the first set of channel walls;
        a second member defining a second set of semi-circular channel walls, the second member being coupled to the first member such that the second set of channels walls are interlaced with the first set of channel walls;
        a fluid inlet provided on one of the first and second members; and
        a fluid outlet provided on one of the first and second members,
        wherein a channel structure defined by the first and second sets of channel walls provides at least two fluid flow paths having different flow directions between the fluid inlet and the fluid outlet, and
        wherein a channel structure defined by the first and second sets of channel wall provides four non-linear flow paths having different flow directions between the fluid inlet and the fluid outlet.

8. The system of claim 7, wherein the fluid inlet is located at a center of the cold plate.

9. The apparatus of claim 7, wherein a surface of a wall of the first set of channel wails is tapered at an angle of greater than about five degrees.

10. The system of claim 7, further comprising:
a heat dissipation device coupled to the cold plate by a loop of tubing;
cooling fluid disposed in the tubing; and
a pump adapted to circulate the cooling fluid.

11. The system of claim 10, further comprising:
a fan adapted to provide cooling air to at least one of the heat dissipation device and the cold plate.

* * * * *